United States Patent
Yeh et al.

(10) Patent No.: US 10,382,052 B2
(45) Date of Patent: *Aug. 13, 2019

(54) CONDITIONAL CORRELATED MULTIPLE SAMPLING SINGLE SLOPE ANALOG-TO-DIGITAL CONVERTER, AND ASSOCIATED IMAGE SENSOR SYSTEM AND METHOD

(71) Applicant: TAIWAN SEMICONDUCTOR MANUFACTURING COMPANY LTD., Hsinchu (TW)

(72) Inventors: Shang-Fu Yeh, Hsin Chu (TW); Kuo-Yu Chou, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/223,859

(22) Filed: Dec. 18, 2018

(65) Prior Publication Data
US 2019/0123754 A1 Apr. 25, 2019

Related U.S. Application Data

(63) Continuation of application No. 15/951,942, filed on Apr. 12, 2018, now Pat. No. 10,158,371, which is a continuation of application No. 14/858,175, filed on Sep. 18, 2015, now Pat. No. 9,960,783.

(51) Int. Cl.
H03M 1/34 (2006.01)
H03M 1/56 (2006.01)
H04N 5/378 (2011.01)

(52) U.S. Cl.
CPC ............... *H03M 1/34* (2013.01); *H03M 1/56* (2013.01); *H04N 5/378* (2013.01)

(58) Field of Classification Search
CPC .. H04N 5/3745; H04N 5/37455; H04N 5/378; H03M 1/00; H03M 1/56
See application file for complete search history.

(56) References Cited

U.S. PATENT DOCUMENTS 9,960,783 B2 * 5/2018 Yeh .......................... H03M 1/34
10,158,371 B2 * 12/2018 Yeh .......................... H03M 1/34

* cited by examiner

*Primary Examiner* — Nelson D. Hernández Hernández
(74) *Attorney, Agent, or Firm* — WPAT, P.C., Intellectual Property Attorneys; Anthony King

(57) ABSTRACT

A conditional correlated multiple sampling (CCMS) single slope (SS) analog-to-digital converter (ADC) is provided. The CCMS SS ADC includes a comparator, arranged to compare an analog signal with a ramp signal and generate a comparison result; and a CCMS control circuit, arranged to determine a swing of the ramp signal according to a magnitude of the analog signal. An image sensor system using the CCMS SS ADC and a method of CCMS SS analog-to-digital conversion are also disclosed.

20 Claims, 7 Drawing Sheets

CONDITIONAL CORRELATED MULTIPLE SAMPLING SINGLE SLOPE ANALOG-TO-DIGITAL CONVERTER, AND ASSOCIATED IMAGE SENSOR SYSTEM AND METHOD

CROSS-REFERENCE TO RELATED APPLICATIONS

This application is a continuation of application Ser. No. 15/951,942, filed on Apr. 12, 2018, which is a continuation of U.S. application Ser. No. 14/858,175, filed on Sep. 18, 2015, and claims priority thereto.

BACKGROUND

Image sensors are widely used in various electronic devices, such as digital still cameras, digital video cameras, cellular phones, security cameras, medical devices and automobile electronics. The image quality of an image sensor is subject to several factors. One of the factors is temporal random noise (RN), including readout noise and quantization noise. RN incurred in an analog readout circuit is one key parameter for determining the quality of an image sensor. Existing methods suffer low frame rate problem or additional hardware cost. It may therefore be desirable to have a novel architecture to address the above mentioned issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
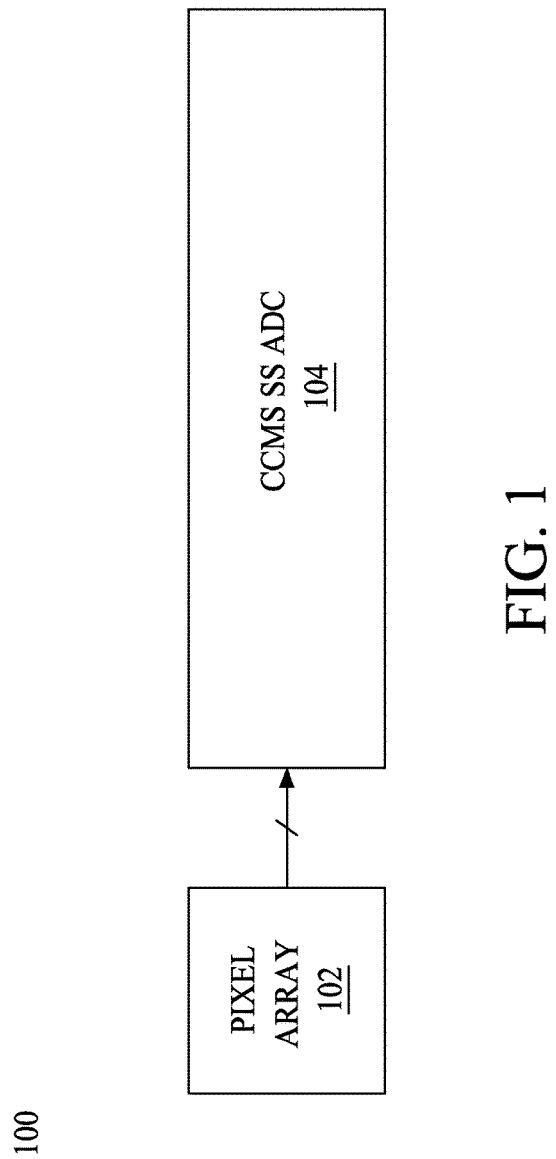
FIG. 1 is a block diagram illustrating an exemplary image sensor system according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The disclosed conditional correlated multiple sampling (CCMS) single slope (SS) analog-to-digital converter (ADC) is applicable to, for example, an image sensor. In an embodiment, the image sensor includes a pixel array, a control circuitry, a readout circuitry, and optional digital processing logic. The readout circuitry is implemented by using the disclosed CCMS SS ADC. The pixel array may include a plurality of columns, each having a plurality of pixel cells. It is to be appreciated that in various embodiments, image sensors may include hundreds or thousands of columns, and each column commonly includes hundreds or thousands of pixels. The pixel array may be a color image sensor including red, green, and blue pixels (or other color patterns) designed to capture images in the visible portion of the spectrum, or may be a black-and-white image sensor and/or an image sensor designed to capture images in the invisible portion of the spectrum, such as infra-red or ultraviolet. Further, the image sensor may be a complementary metal oxide semiconductor (CMOS) image sensor. It is to be appreciated that in other embodiments, the disclosed CCMS SS ADC may be used in other semiconductor circuits/applications.

FIG. 1 is a block diagram illustrating an exemplary image sensor system 100 according to an embodiment of the present disclosure. Referring to FIG. 1, the image sensor system 100 includes a pixel array 102 and a CCMS SS ADC 104. During operation, after each pixel cell in the pixel array 102 has acquired its image data or charge, the image data in analog form (e.g., analog signal) or charge may be read from the pixel cell by the CCMS SS ADC 104 via column readout lines or bit lines. The analog image data from the pixel cells of each column is read out via the bit line readout one pixel at a time by the CCMS SS ADC 104.

In this embodiment, prior to reading out image data from a row of pixels in the pixel array 102, each pixel in the selected row is reset. Resetting may include charging or discharging a floating diffusion region to a predetermined voltage potential such as VDD.

In specific, the readout operation requires two readouts per pixel to be input to the CCMS SS ADC 104: a reset read and an image signal read. The reset read is executed to measure the voltage potential at the floating diffusion region without image charge. The image signal read is executed to measure the voltage potential at the floating diffusion region with image charge, after image charge is transferred to floating diffusion region. Subtracting the voltage potential of the reset read measurement from that of the image signal read measurement can effectively decrease a noise level indicative of the image charge at floating diffusion region. In this embodiment, each of the reset read measurement and the image signal read measurement is converted by the CCMS SS ADC 104. Then the subtraction of the two values may be done in the digital domain to obtain the digital image data.

The concept of the CCMS SS ADC 104 of the present disclosure is to convert each analog image data output from a pixel based on a first voltage ramp or a second voltage ramp according to the magnitude of the analog image data, wherein the second voltage ramp having a reduced ramp swing compared with the first voltage ramp. first For a bright pixel having analog image data higher than a predefined threshold in magnitude, the first voltage ramp is applied. Accordingly, the bright pixel is converted for only one time to obtain a digital image data. Whereas for a dark pixel having analog image data not higher than the predefined threshold, the second voltage ramp is applied. Because the second voltage ramp finishes their conversion faster than the first voltage ramp, the CCMS SS ADC 104 can start a new conversion if the output was determined for a previous conversion. The dark pixel is therefore converted for several times in a repeating cycle to obtain an averaged digital image data.

As a consequence of the conditional correlated multiple sampling mechanism, the number of conversions taken for each pixel depends on its signal level. Dark pixels are converted more times than bright pixels. The operation time period for the bright pixel and the operation time period for the dark pixel can be identical. In that case, a multiple sampled digital image data with a mitigated temporal noise can be achieved for the dark pixel without suffering the additional operation time with respect to the bright pixel.

The CCMS SS ADC 104 may have reduced quantization noise, and thus possess upgraded performance as a ramp ADC of relatively high resolution. For example, a 10-bit SS ADC according to the disclosure discussed herein may act as a conventional 12-bit SS ADC, while only taking about one fourth the conversion time. The 10-bit SS ADC according to the disclosure may even perform better than the conventional 12-bit SS ADC for low signal levels, since readout noise is also reduced.

Figure 2:
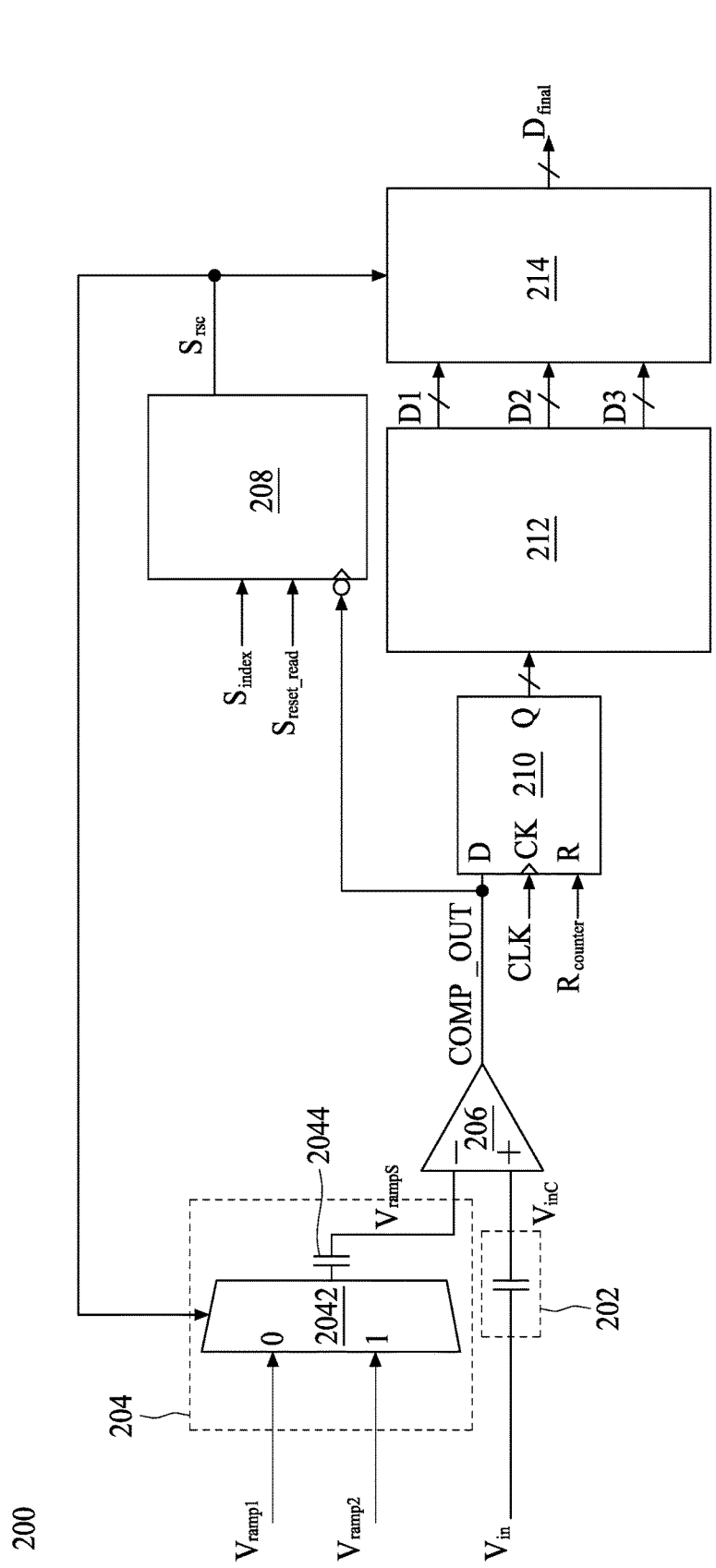
FIG. 2 is a block diagram illustrating an exemplary conditional correlated multiple sampling (CCMS) single slope (SS) analog-to-digital converter (ADC) according to an embodiment of the present disclosure.

FIG. 2 is a block diagram illustrating an exemplary CCMS SS ADC 200 according to an embodiment of the present disclosure. Referring to FIG. 2, the CCMS SS ADC 200 includes an input stage 202, a ramp switch circuit 204, a comparator 206, a CCMS control circuit 208, a counter 210, a memory circuit 212 and an arithmetic operator 214. It is to be appreciated that the CCMS SS ADC 200 is one implementation of the CCMS SS ADC 104 shown in FIG. 1.

As shown in FIG. 2, an analog signal $V_{in}$, which in the exemplary embodiment is an analog image data from a column bit line of the image sensor system 100, is fed into the input stage 202. The input stage 202 outputs an analog signal $V_{inC}$ to a non-inverting input of the comparator 206. In the exemplary embodiment, the input stage 202 may include a filter, e.g. a capacitor that couples instantaneous changes reflecting a high frequency band in the analog signal $V_{in}$ to the non-inverting input of the comparator 206.

The ramp switch circuit 204 receives a first ramp signal $V_{ramp1}$ and a second ramp signal $V_{ramp2}$, and generates a selected ramp signal $V_{rampS}$ in response to a ramp switch control signal $S_{rsc}$. The first ramp signal $V_{ramp1}$ and the second ramp signal $V_{ramp2}$ have substantially a same slope. The first ramp signal $V_{ramp1}$ has a ramp swing greater than the second ramp signal $V_{ramp2}$. In some embodiments, the first ramp signal $V_{ramp1}$ and the second ramp signal $V_{ramp2}$ are global ramp signals provided to a plurality of adaptive ADCs following a pixel array. In the present embodiment, the ramp switch circuit 204 includes a switch 2042 and a filter, e.g. a capacitor 2044. The purpose of employing the filter 2044 is the same or similar to that of the filter 202. In some embodiments, the filter 2044 may be omitted. A period P2 of the second ramp signal $V_{ramp2}$ is shorter than a period P1 of the first ramp signal $V_{ramp1}$. In the exemplary embodiment, the period P1 is four times the period P2. It is to be appreciated that the ratio between the period P1 and the period P2 is not a limitation of the present disclosure. For example, in some embodiments, the period P1 may be two times the period P2. In other embodiments, the period P1 may be 2.5 times the period P2.

Each complete cycle (i.e., one period) of the first ramp signal $V_{ramp1}$ and the second ramp signal $V_{ramp2}$ represents one conversion of the analog input. In this embodiment, a conversion time allocated to each pixel serially from an upstream pixel array equals to the period P1 of the first ramp signal $V_{ramp1}$. That is, the analog signal $V_{in}$ is converted four times when it is determined to use the second ramp signal $V_{ramp2}$ as the selected ramp signal $V_{rampS}$ according to the ramp switch control signal $S_{rsc}$, whereas the analog signal $V_{in}$ is converted merely one time when it is determined to use the first ramp signal $V_{ramp1}$ as the selected ramp signal $V_{rampS}$. When the ratio between the period P1 and the period P2 is not an integer, which is composed of an integer part I and a fractional part F, the analog signal $V_{in}$ is converted I times when it is determined to use the second ramp signal $V_{ramp2}$ as the selected ramp signal $V_{rampS}$ according to the ramp switch control signal $S_{rsc}$. In one embodiment, as will be discussed in more detail below, the determination of the ramp switch control signal $S_{rsc}$ is dependent on a magnitude of the analog signal $V_{in}$.

The comparator 206 compares the input analog signal $V_{inC}$ with the selected ramp signal $V_{rampS}$. As a consequence, during the operation, a comparison result COMP_OUT produced by the comparator 206 changes in voltage level as the magnitude of the selected ramp signal $V_{rampS}$ reaches that of the input analog signal $V_{inC}$. The CCMS control circuit 208 is utilized to control the ramp switch circuit 204 and the arithmetic operator 214 in response to the comparison result COMP_OUT.

Figure 3:
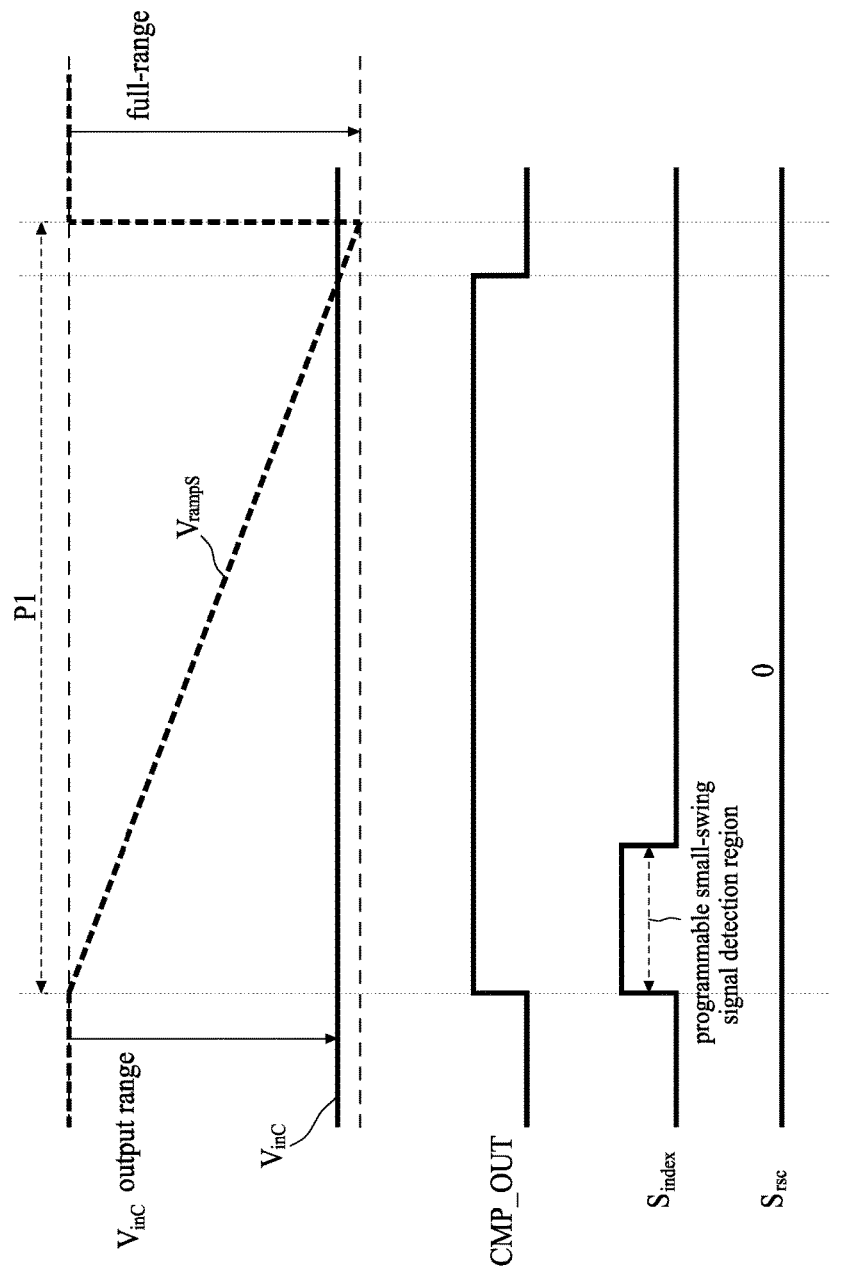
FIG. 3 is a waveform diagram illustrating a bright pixel scenario according to an exemplary embodiment of the present disclosure.

Please refer to FIG. 3 in conjunction with FIG. 2. FIG. 3 is a waveform diagram illustrating determination of the ramp switch control signal according to an exemplary embodiment of the present disclosure. As illustrated in FIG. 3, an incoming input analog signal $V_{inC}$ may have a negative voltage level. An output range of the incoming analog signal $V_{inC}$ is denoted as "$V_{inC}$ output range." Initially, the ramp switch control signal $S_{rsc}$ is reset to 1'b0, which indicates the first ramp signal $V_{ramp1}$ is selected as a default choice to act as the selected ramp signal $V_{rampS}$. The comparator 206 compares the selected ramp signal $V_{rampS}$ and the input analog signal $V_{inC}$. Initially, the comparison result COMP_OUT of the comparator 206 is reset to 1'b0. When the analog signal $V_{inC}$ starts to be fed into the comparator 206, the comparison result COMP_OUT is asserted to 1'b1. During the comparison, the comparison result COMP_OUT is deasserted when the selected ramp signal $V_{rampS}$ negatively exceeds the $V_{inC}$ output range. As a result, the time period of the assertion of the comparison result COMP_OUT can be substantially proportional to the $V_{inC}$ output range.

Further illustrated in FIG. 3, a programmable small-swing signal detection region, which is a time period of an assertion of a signal $S_{index}$, is shown under the comparison result COMP_OUT. The programmable small-swing signal detection region has a predefined time period that can be used to determine which one of the bright pixel process and the dark pixel process should be adopted for the present input analog signal $V_{inC}$. The CCMS control circuit 208 operationally monitors the relationship between the comparison result COMP_OUT and the programmable small-swing signal detection region. When the desertion time point of the comparison result COMP_OUT is not earlier than the desertion time point of the signal $S_{index}$, the ramp switch control signal $S_{rsc}$ is not asserted, and the present input analog signal $V_{inC}$ is regarded as a bright pixel. The embodiment shown in FIG. 3 is a bright pixel case. Whereas when the desertion time point of the comparison result COMP_OUT is earlier than the desertion time point of the signal $S_{index}$, the ramp switch control signal $S_{rsc}$ is immediately asserted, and the present input analog signal $V_{inC}$ is regarded as a dark pixel.

Figure 4:
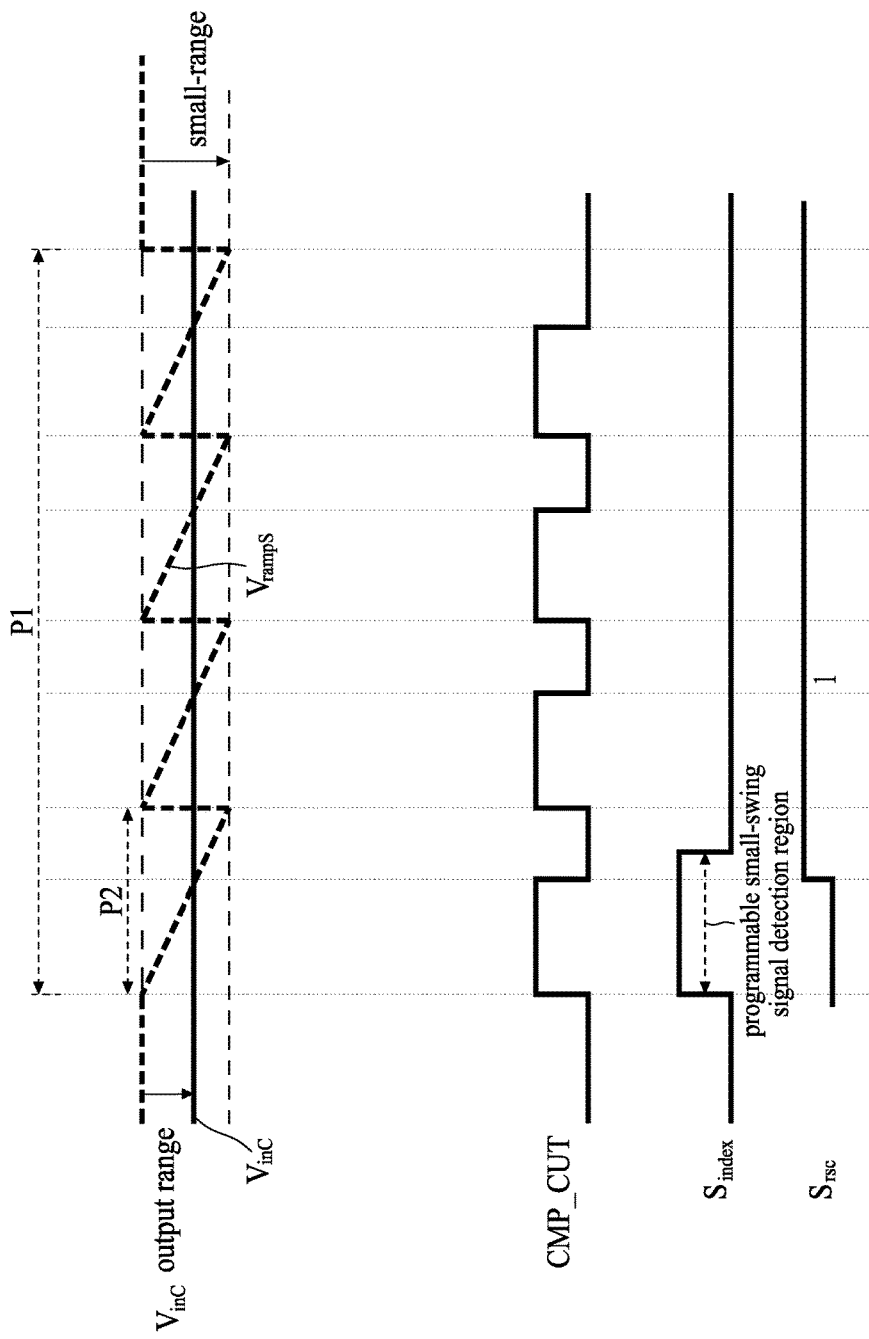
FIG. 4 is a waveform diagram illustrating a dark pixel scenario according to an exemplary embodiment of the present disclosure.

The embodiment shown in FIG. 4 is a dark pixel case. As illustrated in FIG. 4, the ramp switch control signal $S_{rsc}$ is asserted immediately when the CCMS control circuit 208 determines that the present input analog signal $V_{inC}$ is a dark pixel according to the fact that the first desertion time point of the comparison result COMP_OUT falls within a range of the programmable small-swing signal detection region. As a result, the ramp switch circuit 204 switches its switch 2042 to output the second ramp signal $V_{ramp2}$ as the selected ramp signal $V_{rampS}$. Thereafter, the input analog signal $V_{inC}$ is repeatedly converted to the comparison result COMP_OUT for further 3 times in this embodiment. By appropriately defining the time period of the programmable small-swing signal detection region, multiple conversion for a determined dark pixel without overflow can be achieved by using the second ramp signal $V_{ramp2}$; while a single conversion for a determined bright pixel can be achieved by using the first ramp signal $V_{ramp1}$.

Referring back to FIG. 2, the counter 210 is coupled to the comparator 206 and counts a cycle number of a system provided reference clock CLK number until the magnitude of the selected ramp signal $V_{rampS}$ reaches the magnitude of the input analog signal $V_{inC}$ for each period of the selected ramp signal $V_{rampS}$. For example, the comparison result COMP_OUT may be coupled to a data input terminal of the counter 210, such that counter 210 counts the time period of the comparison result COMP_OUT based on the reference clock CLK coupled to a clock terminal CK of the counter 210. The counter 210 is further reset by a reset signal $R_{counter}$ coupled to a reset terminal R of the counter 210. However, it is to be appreciated that other suitable structures to achieve the same or similar functions also fall within the contemplated scope of the present disclosure.

Figure 5:
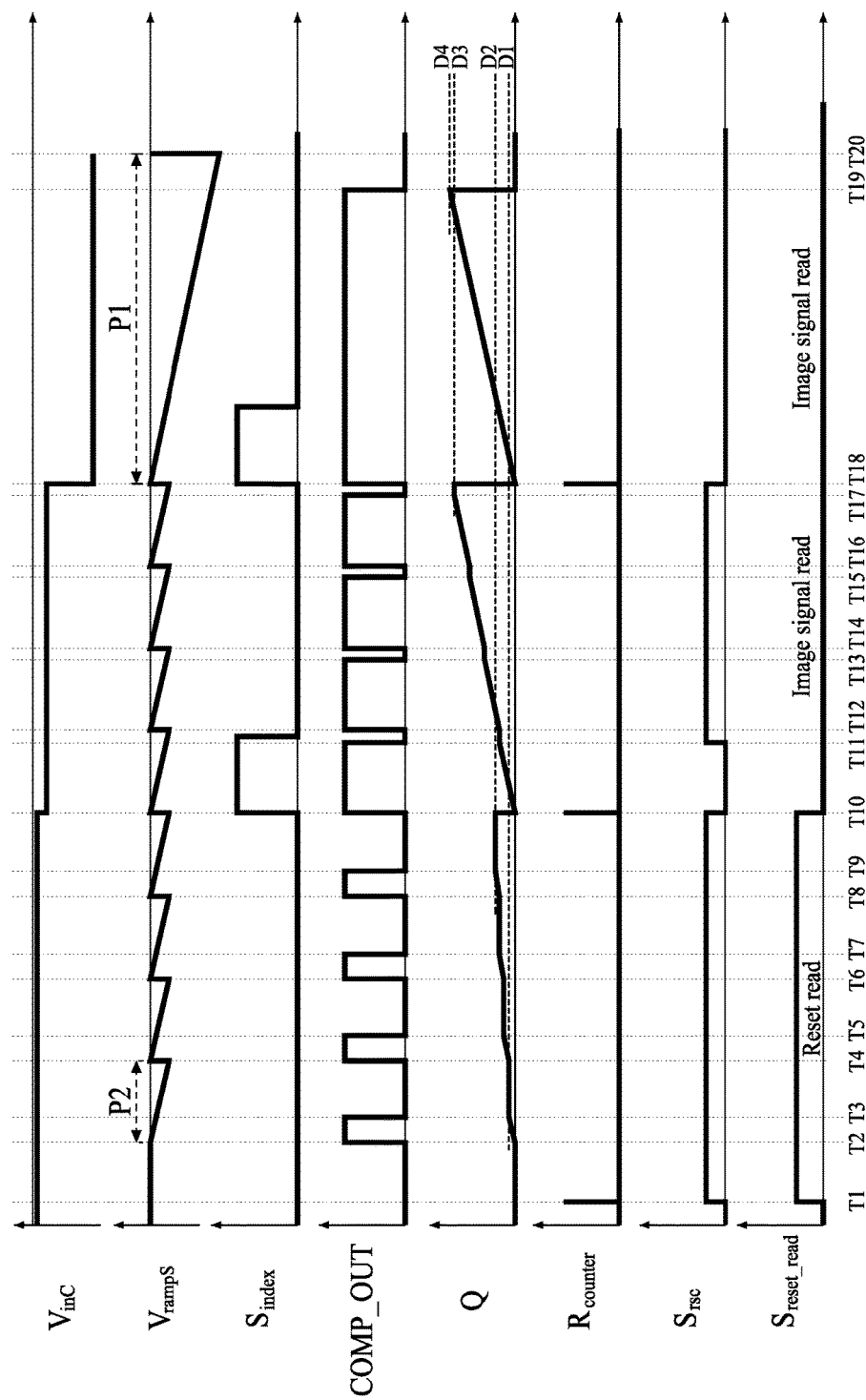
FIG. 5 is a waveform diagram illustrating operation of the CCMS SS ADC in FIG. 2 according to an exemplary embodiment of the present disclosure.

Please refer to FIG. 5 in conjunction with FIG. 2. FIG. 5 is a waveform diagram illustrating operation of the CCMS SS ADC 200 according to an exemplary embodiment of the present disclosure. As mentioned above, the reset read and the image signal read are both executed to measure the voltage potential at the floating diffusion region without image charge and the voltage potential at the floating diffusion region with image charge, after image charge is transferred to floating diffusion region. A reset read indicator $S_{reset\_read}$ is input to the CCMS control circuit 208 to indicate whether a current read stage is the reset read stage. At a starting time point T1, the reset read indicator $S_{reset\_read}$ is asserted. The counter 210 is reset by the reset signal $R_{counter}$, so that a value Q output from the counter 210 is reset to 0. Please note that since the voltage potential at the floating diffusion region without image charge normally has a small magnitude, i.e., the voltage level, the CCMS control circuit 208 is configured to directly cause the ramp switch control signal $S_{rsc}$ to be 1'b1 at the reset read stage without the comparison with the signal $S_{index}$. As a result, the second ramp signal $V_{ramp2}$ with a small range is used to output as the selected ramp signal $V_{rampS}$ for measuring a magnitude of the analog signal $V_{inC}$ at the reset read stage.

As can be seen in FIG. 5, the value Q output from the counter 210 is accumulated from 0 to D1 during a time period between time points T2 and T3 for a first count of the analog signal $V_{inC}$ by using the first selected ramp signal $V_{rampS}$. The value D1 then is stored in the memory circuit 212.

For the remaining cycles of the reset read stage, the counter 210 is not reset by the reset signal $R_{counter}$ and keeps accumulating the value Q. The value Q output from the counter 210 is accumulated during a time period between time points T4 and T5 for a second count of the analog signal $V_{inC}$, a time period between time points T6 and T7 for a third count of the analog signal $V_{inC}$, and a time period between time points T8 and T9 for a fourth count of the analog signal $V_{inC}$, by using the first selected ramp signal $V_{rampS}$. The final value D2 obtained after the fourth count then is stored in the memory circuit 212 for further use as will be described later.

After execution of the reset read, the operation proceeds to image signal read execution. As illustrated in FIG. 5, two image signal read execution cycles are performed subsequent to the reset read execution cycle. Please note that each time a new reset read execution cycle begins, the counter 210 resets its output value Q to the reset value 0.

For the first image signal read execution cycle, i.e. a time period between time points T10 and T18, the comparator 206 counts a cycle number of the reference clock CLK number until the magnitude of the selected ramp signal $V_{rampS}$ reaches the magnitude of the input analog signal $V_{inC}$ at a time point T11. As such, a digitized length of the comparison result COMP_OUT, which also indicates the magnitude, i.e., the voltage level of the analog signal $V_{inC}$ can be obtained. As can be seen from FIG. 5, the comparison result COMP_OUT deasserts at the time point T11 earlier than a desertion time of the signal $S_{index}$, thus the CCMS control circuit 208 determines switching to the second ramp signal $V_{ramp2}$ for the following three counts. In specific, the following three counts produce the comparison results COMP_OUT having lengths between time points T12 and T13, T14 and T15, and T16 and T17. A final counting value D at the time point T17 is stored in the memory circuit 212 as a value D3.

For the second image signal read execution cycle, i.e., a time period between time points T18 and T20, the comparator 206 counts a cycle number of the reference clock CLK number until the magnitude of the selected ramp signal $V_{rampS}$ reaches the magnitude of the input analog signal $V_{inC}$ at a time point T19. As such, a digitized length of the comparison result COMP_OUT, which also indicates the magnitude, i.e., the voltage level of the analog signal $V_{inC}$, can be obtained. As can be seen from FIG. 5, the comparison result COMP_OUT deasserts at the time point T19 later than a desertion time of the signal $S_{index}$, thus the CCMS control circuit 208 determines not to switch to the second ramp signal $V_{ramp2}$ and keeps using the first ramp signal $V_{ramp1}$ for the entire counting operation. Unlike the first image signal read operation which performs total four counting operations, there is only one counting operation for the second image signal read operation. A final counting value D at the time point T19 is stored in the memory circuit 212 as a value D4.

Please note that the values D1 and D2 stored in the memory circuit 212 are kept until the next reset read operation is performed, whereas the value D3 is reset and updated for each image signal read operation. Based on the configuration made according to the present disclosure, the arithmetic operator 214 integrates the information including the values D1, D2 and D3 output from the memory circuit 212, and the ramp switch control signal $S_{rsc}$ to obtain a final output $D_{final}$ of the CCMS SS ADC 200, as expressed in equation (1) below:

$$D_{final} = S_{rsc} \times \frac{(D3-D2)}{4} + \overline{S_{rsc}} \times (D3-D1) \qquad (1)$$

Please note that the equation (1) is applied during the image signal read operations. Conceptually, the final output $D_{final}$ is produced by subtracting the reset read measurement from the image signal read measurement, in order to decrease a noise level indicative of the image charge at floating diffusion region. When the ramp switch control signal $S_{rsc}$ indicates a situation that the currently input analog signal $V_{inC}$ is a dark pixel, the final output $D_{final}$ is calculated by subtracting D2 from D3, and dividing the subtracting result by four, to produce an averaged output value, so that the temporal noise can be mitigated. When the ramp switch control signal $S_{rsc}$ indicates a situation that the currently input analog signal $V_{inC}$ is a bright pixel, the final output $D_{final}$ is calculated by simply subtracting D1 from D3, to produce an output value without averaging.

Figure 6:
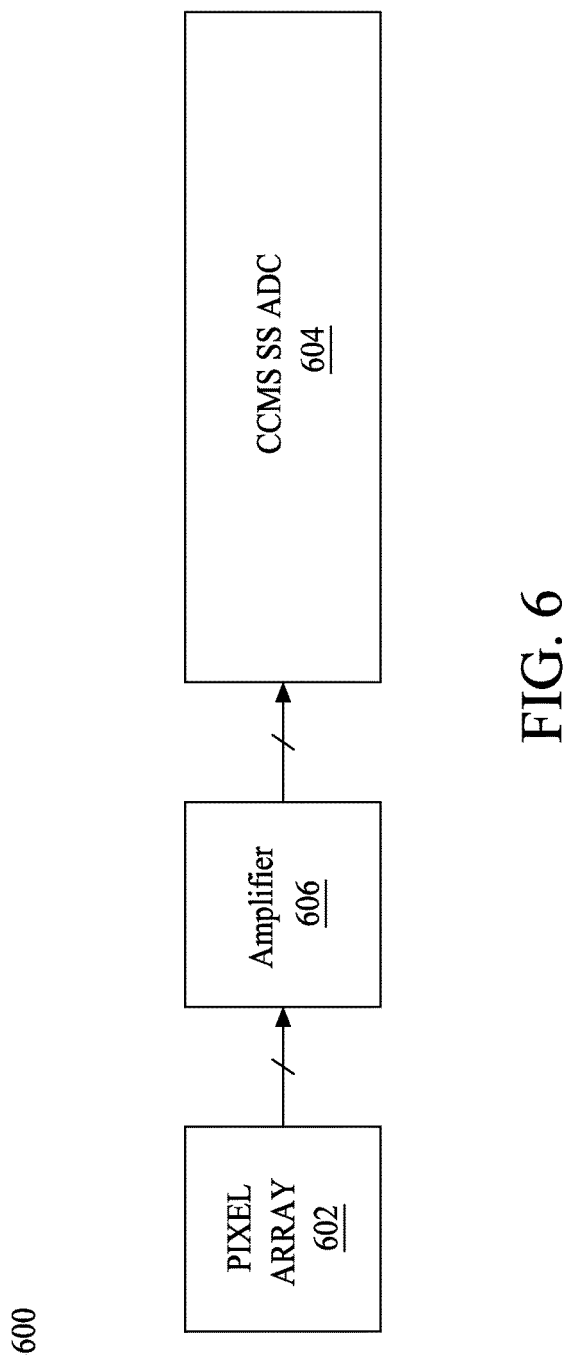
FIG. 6 is a block diagram illustrating an image sensor system according to another embodiment of the present disclosure.

FIG. 6 is a block diagram illustrating an image sensor system 600 according to another embodiment of the present disclosure. Referring to FIG. 6, the image sensor system 600 includes a pixel array 602, an amplifier 606 and a CCMS SS ADC 604. The pixel array 602 is substantially the same or similar to the pixel array 102. The CCMS SS ADC 604 may also be substantially the same or similar to the CCMS SS ADC 104 or the CCMS SS ADC 200 except some modifications may be required in accordance with the specification of the amplifier 606. During operation, after each pixel cell in the pixel array 602 has acquired its image data or charge, the image data in analog form (e.g., analog signal) or charge may be read out of the pixel cell via column readout lines or bit lines. The image data is then fed to the CCMS SS ADC 604 after amplified by a gain of the amplifier 606. The amplified analog image data from the pixel cells of each column is read out via the bit line readout one pixel at a time to the CCMS SS ADC 604.

Figure 7:
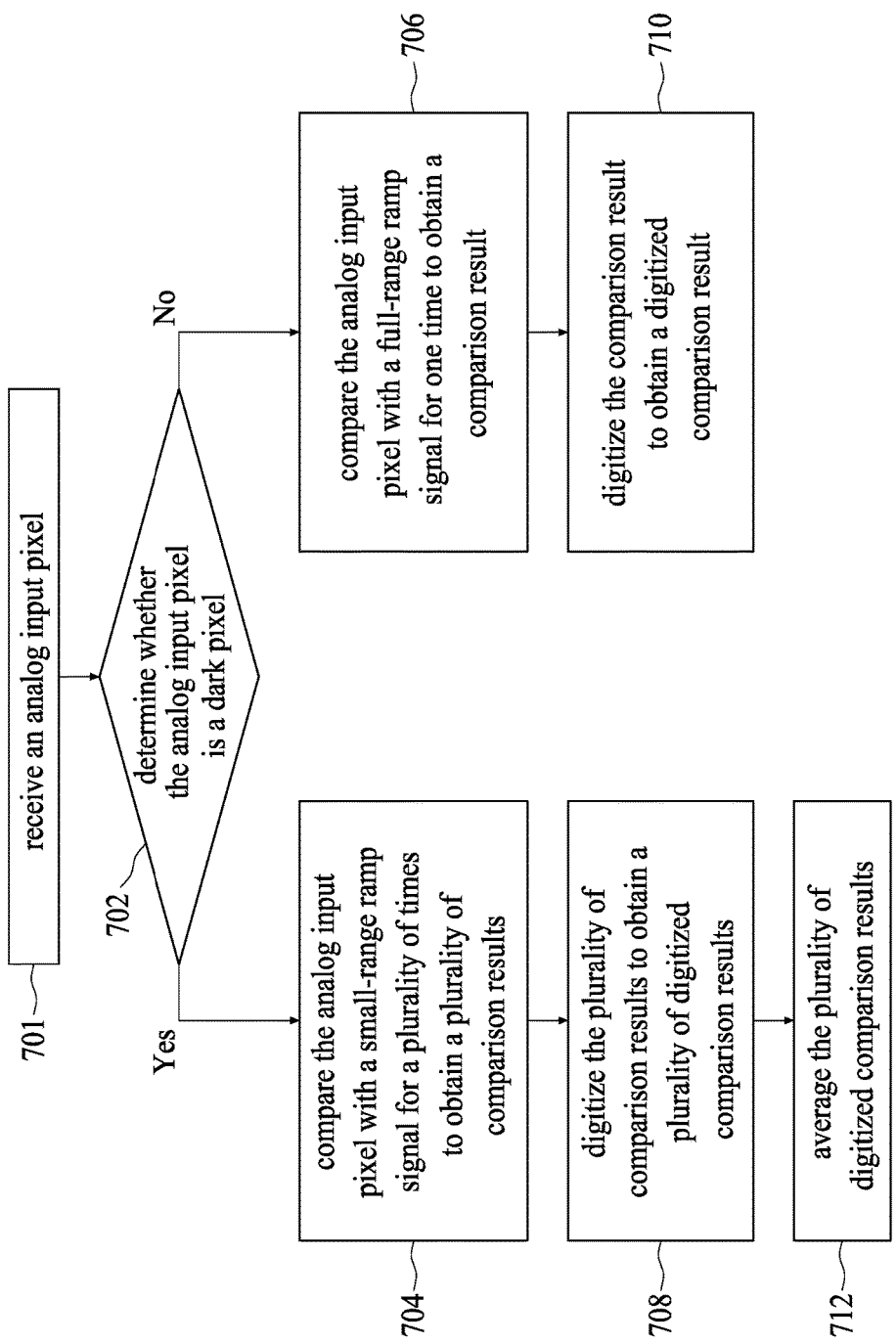
FIG. 7 is a conceptual flow diagram illustrating a method of CCMS SS analog-to-digital conversion according to an embodiment of the present disclosure.

FIG. 7 is a flow diagram illustrating a method of CCMS SS analog-to-digital conversion according to an embodiment of the present disclosure. The CCMS SS analog-to-digital conversion method will now be described with reference to the CCMS SS ADC 200.

In operation 701, an analog input pixel is received.

In operation 702, the CCMS control circuit 208 determines whether the analog input pixel is a dark pixel. If affirmative, the comparator 206 compares the analog input pixel with a second ramp signal having a reduce ramp swing compared with a first ramp signal for a plurality of times to obtain a plurality of comparison results in operation 704. Thereafter, in operation 708, the counter 210 digitizes the plurality of comparison results to obtain a plurality of digitized comparison results. In operation 712, the arithmetic operator 214 averages the plurality of digitized comparison results.

If in operation 702 it is determined that the analog input pixel is not a dark pixel (i.e. a bright pixel), the comparator 206 compares the analog input pixel with the first ramp signal for one time to obtain a comparison result in operation 706. Next, in operation 710, the counter 210 digitizes the plurality of comparison results to obtain a plurality of digitized comparison results.

Please note that the CCMS SS analog-to-digital conversion method shown in FIG. 7 illustrates a conceptual flow of the present disclosure for the image signal read operation, wherein the reset read is not mentioned. In some embodiments, the reset read operation may be incorporated into the CCMS SS analog-to-digital conversion method shown in FIG. 7 based on the reset read operation described in the previous paragraphs.

Some embodiments of the present disclosure provide a conditional correlated multiple sampling (CCMS) single slope (SS) analog-to-digital converter (ADC). The CCMS SS ADC includes a comparator, arranged to compare an analog signal with a ramp signal and generate a comparison result; and a CCMS control circuit, arranged to determine a swing of the ramp signal according to a magnitude of the analog signal.

In some embodiments of the present disclosure, the CCMS SS ADC further includes a switch for selectively outputting one of a first ramp signal and a second ramp signal as the ramp signal according to the determination produced by the CCMS control circuit, wherein the first ramp signal has a first swing greater than a second swing of the second ramp signal.

In some embodiments of the present disclosure, when the magnitude of the analog signal is not smaller than a predefined value, the CCMS control circuit determines to select the first ramp signal to act as the ramp signal; when the magnitude of the analog signal is smaller than the predefined value, the CCMS control circuit determines to select the second ramp signal to act as the ramp signal.

In some embodiments of the present disclosure, a ratio of a cycle time of the first ramp signal over a cycle time of the second ramp signal is greater than 1.

In some embodiments of the present disclosure, when the CCMS control circuit determines to select the first ramp signal to act as the ramp signal, the comparator compares the analog signal with the ramp signal for once, and when the CCMS control circuit determines to select the second ramp signal to act as the ramp signal, the comparator compares the analog signal with the ramp signal repeatedly for more than once.

In some embodiments of the present disclosure, the CCMS SS ADC further includes an arithmetic operator arranged to obtain an averaged comparison result when the comparator compares the analog signal with the ramp signal repeatedly for more than once.

In some embodiments of the present disclosure, the CCMS SS ADC further includes a counter arranged to digitize a time period of the comparison result.

Some embodiments of the present disclosure provide an image sensor system. The image sensor system includes a pixel array, including a plurality of pixel cells arranged into rows and columns; a bit line coupled to at least one of the pixels within a column of the pixel array; and a conditional correlated multiple sampling (CCMS) single slope (SS) analog-to-digital converter (ADC) coupled to the bit line readout from the at least one pixel, the CCMS SS ADC including a CCMS control circuit, arranged to determine whether an analog input pixel is a dark pixel; and a comparator, arranged to compare the analog input pixel with a first ramp signal having a first swing for m times when the analog input pixel is determined to be the dark pixel; and compare the analog input pixel with a second ramp signal having a second swing for n times when the analog input pixel is not determined to be the dark pixel; wherein the first swing is smaller than the second swing, and m and n may be integers, m being greater than n.

In some embodiments of the present disclosure, the image sensor system further includes an amplifier coupled between the bit line readout and the CCMS SS ADC.

In some embodiments of the present disclosure, the CCMS SS ADC further includes a switch for selective connecting one of the first ramp signal and the second ramp signal to the comparator according to the determination produced by the CCMS control circuit.

In some embodiments of the present disclosure, when the magnitude of the analog input pixel is smaller than a predefined value, the CCMS control circuit determines the analog input pixel to be a dark pixel.

In some embodiments of the present disclosure, the CCMS SS ADC further includes an arithmetic operator arranged to average m comparison results when the analog input pixel is determined to be the dark pixel.

In some embodiments of the present disclosure, the image sensor system further includes a counter arranged to digitize a time period of the comparison result.

Some embodiments of the present disclosure provide a method conditional correlated multiple sampling (CCMS) single slope (SS) analog-to-digital conversion. The method includes: comparing an analog signal with a ramp signal and generating a comparison result; and determining a swing of the ramp signal according to a magnitude of the analog signal.

In some embodiments of the present disclosure, the CCMS SS analog-to-digital conversion method further includes selectively outputting one of a first ramp signal or a second ramp signal as the ramp signal according to the determination on the swing of the ramp signal, wherein the first ramp signal has a first swing greater than a second swing of the second ramp signal.

In some embodiments of the present disclosure, determining the swing of the ramp signal according to the magnitude of the analog signal includes when the magnitude of the analog signal is not smaller than a predefined value, determining to select the first ramp signal to act as the ramp signal, and when the magnitude of the analog signal is smaller than the predefined value, determining to select the second ramp signal to act as the ramp signal.

In some embodiments of the present disclosure, a ratio of a cycle time of the first ramp signal to a cycle time of the second ramp signal is greater than 1.

In some embodiments of the present disclosure, comparing the analog signal with the ramp signal and generating the comparison result includes when it is determined to select the first ramp signal to act as the ramp signal, comparing the analog signal with the ramp signal for once, and when it is determined to select the second ramp signal to act as the ramp signal, comparing the analog signal with the ramp signal repeatedly for more than once.

In some embodiments of the present disclosure, the CCMS SS analog-to-digital conversion method further includes obtaining an averaged comparison result when the analog signal is compared with the ramp signal repeatedly for more than once.

In some embodiments of the present disclosure, the CCMS SS analog-to-digital conversion method further includes digitizing a time period of the comparison result.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An analog-to-digital converter (ADC), comprising:
    a comparator, arranged to compare an analog signal with a ramp signal and generate a comparison result;
    a switch, including a first ramp input terminal and a second ramp input terminal arranged to receive a first ramp signal and a second ramp signal respectively, wherein the first ramp signal has a first swing greater than a second swing of the second ramp signal;
    a control circuit, coupled to the comparator and the switch, the control circuit being arranged to receive a signal, and a time period of an assertion of the signal representing a programmable small-swing signal detection region, wherein the control circuit controls the switch to output the first ramp signal or the second ramp signal as the ramp signal according to a magnitude of the analog signal and the time period of the assertion of the signal representing the programmable small-swing signal detection region; and an arithmetic operator arranged to obtain an averaged comparison result based on the comparison result.

2. The ADC of claim 1, wherein when the magnitude of the analog signal is not smaller than a predefined value corresponding to the time period of the assertion of the signal representing the programmable small-swing signal detection region, the control circuit selects the first ramp signal to act as the ramp signal; when the magnitude of the analog signal is smaller than the predefined value corresponding to the time period of the assertion of the signal representing the programmable small-swing signal detection region, the control circuit selects the second ramp signal to act as the ramp signal.

3. The ADC of claim 1, wherein a ratio of a cycle time of the first ramp signal over a cycle time of the second ramp signal is greater than 1.

4. The ADC of claim 3, wherein when the control circuit selects the first ramp signal to act as the ramp signal, the comparator compares the analog signal with the ramp signal for once, and when the control circuit selects the second ramp signal to act as the ramp signal, the comparator compares the analog signal with the ramp signal repeatedly for more than once.

5. The ADC of claim 4, wherein the arithmetic operator is arranged to obtain the averaged comparison result when the comparator compares the analog signal with the ramp signal repeatedly for more than once.

6. The ADC of claim 1, further comprising a counter, used to count a cycle number of a reference clock until a magnitude of the first ramp signal or a magnitude of the second ramp signal reaches the magnitude of the analog signal.

7. An image sensor system, comprising:
a pixel array, comprising a plurality of pixel cells arranged into rows and columns;
an analog-to-digital converter (ADC) coupled to the at least one pixel, the ADC comprising:
a control circuit, arranged to receive a signal, wherein the control circuit determines whether an analog input pixel of the at least one pixel is a dark pixel according to a magnitude of the analog signal and a time period of an assertion of the signal; and
a comparator, arranged to compare the analog input pixel with a first ramp signal having a first swing for m times when the analog input pixel is determined to be the dark pixel; and compare the analog input pixel with a second ramp signal having a second swing for n times when the analog input pixel is not determined to be the dark pixel; wherein the first swing is smaller than the second swing, and m being greater than n; and
an arithmetic operator arranged to average m comparison results when the analog input pixel is determined to be the dark pixel.

8. The image sensor system of claim 7, wherein the time period of the assertion of the signal representing a programmable small-swing signal detection region.

9. The image sensor system of claim 8, wherein when the magnitude of the analog input pixel is smaller than a predefined value corresponding to the time period of the assertion of the signal representing the programmable small-swing signal detection region, the control circuit determines the analog input pixel to be a dark pixel.

10. The image sensor system of claim 7, wherein the ADC further comprises a switch for selectively outputting one of the first ramp signal or the second ramp signal to the comparator according to the determination produced by the control circuit.

11. The image sensor system of claim 7, wherein the ADC further comprises a counter, used to count a cycle number of a reference clock until a magnitude of the first ramp signal or a magnitude of the second ramp signal reaches the magnitude of the analog signal for m or n times respectively.

12. The image sensor system of claim 7, further comprising an amplifier coupled between the pixel array and the ADC.

13. The image sensor system of claim 7, wherein a ratio of a cycle time of the first ramp signal over a cycle time of the second ramp signal is greater than 1.

14. A method of analog-to-digital conversion, the method comprising:
receiving a signal, and a predefined time period of an assertion of the signal representing a programmable small-swing signal detection region;
amplifying an input signal on a bit line by a gain greater than 1 to generate an analog signal;
selectively outputting a first ramp signal or a second ramp signal as a ramp signal according to a magnitude of the analog signal and the predefined time period, wherein the first ramp signal has a first swing greater than a second swing of the second ramp signal; and
obtaining an analog-to-digital conversion result according to the ramp signal and the analog signal.

15. The analog-to-digital conversion method of claim 14, wherein selectively outputting the first ramp signal or the second ramp signal as the ramp signal according to the magnitude of the analog signal and the predefined time period comprises:
when the magnitude of the analog signal is not smaller than a predefined value corresponding to the predefined time period of the assertion of the signal representing the programmable small-swing signal detection region, determining to select the first ramp signal to act as the ramp signal, and when the magnitude of the analog signal is smaller than the predefined value corresponding to the predefined time period of the assertion of the signal representing the programmable small-swing signal detection region, determining to select the second ramp signal to act as the ramp signal.

16. The analog-to-digital conversion method of claim 14, wherein a ratio of a cycle time of the first ramp signal to a cycle time of the second ramp signal is greater than 1.

17. The analog-to-digital conversion method of claim 14, furthering comprising:
counting a cycle number of a reference clock until a magnitude of the first ramp signal or a magnitude of the second ramp signal reaches the magnitude of the analog signal to generate a counting result.

18. The analog-to-digital conversion method of claim 17, wherein counting the cycle number of the reference clock until the magnitude of the first ramp signal or the magnitude of the second ramp signal reaches the magnitude of the analog signal to generate the counting result comprises:
counting the cycle number of the reference clock until the magnitude of the first ramp signal or the magnitude of the second ramp signal reaches the magnitude of the analog signal to generate the counting result for m or n times respectively.

19. The analog-to-digital conversion method of claim 18, wherein m and n are positive integers, and m and n are greater than 0.

20. The analog-to-digital conversion method of claim 19, wherein m is greater than n.

* * * * *